(12) United States Patent
Carrillo-Ramirez (10) Patent No.: US 9,431,320 B2
(45) Date of Patent: Aug. 30, 2016

(54) METHODS AND STRUCTURES TO FACILITATE THROUGH-SILICON VIAS

(71) Applicant: ANALOG DEVICES, INC., Norwood, MA (US)

(72) Inventor: Rodrigo Carrillo-Ramirez, Chelmsford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 66 days.

(21) Appl. No.: 14/021,894

(22) Filed: Sep. 9, 2013

(65) Prior Publication Data

US 2014/0264881 A1 Sep. 18, 2014

Related U.S. Application Data

(60) Provisional application No. 61/789,571, filed on Mar. 15, 2013.

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/00* | (2006.01) | |

(52) U.S. Cl.
CPC ............ *H01L 23/481* (2013.01); *H01L 24/03* (2013.01); *H01L 24/05* (2013.01); *H01L 2224/05624* (2013.01); *H01L 2224/05647* (2013.01); *H01L 2924/0002* (2013.01); *H01L 2924/10253* (2013.01)

(58) Field of Classification Search
CPC ........... H01L 23/481; H01L 21/76898; H01L 2225/06541

USPC .................................................. 257/758, 774
See application file for complete search history.

(56) References Cited

U.S. PATENT DOCUMENTS

| | | | |
|---|---|---|---|
| 6,313,537 | B1 | 11/2001 | Lee et al. |
| 6,448,641 | B2 | 9/2002 | Ker et al. |
| 7,160,795 | B2 | 1/2007 | Batra et al. |
| 2009/0243074 | A1 | 10/2009 | Ramiah et al. |

(Continued)

FOREIGN PATENT DOCUMENTS

KR 10-2012-0005385 A 1/2012

OTHER PUBLICATIONS

International Search Report and Written Opinion dated Jul. 25, 2014 in corresponding PCT Application No. PCT/US2014/016493.

*Primary Examiner* — Thien F Tran
(74) *Attorney, Agent, or Firm* — Knobbe, Martens, Olson & Bear LLP (57) ABSTRACT

In some implementations, a metal pad for capturing or interfacing with through-silicon vias has a plurality of openings through it. Another metal pad on an upper level can also include a plurality of openings. The metal pads are vertically aligned and the placement of the openings in each metal pad is such that the openings are laterally offset and substantially do not directly overlie or underlie one another. As seen in a top-down view, the through-silicon via etch may "see" a metal etch stop that extends continuously across the width of the via, although different portions of the etch stop may be distributed on different vertical levels due to the presence of openings in the metal pads. The openings in the metal pads facilitate integrated circuit fabrication their respective levels and the aggregate structure formed by the metal pads provides an effective etch stop for the through-silicon via etch.

16 Claims, 6 Drawing Sheets

(56) References Cited

U.S. PATENT DOCUMENTS

| | | |
|---|---|---|
| 2011/0209911 A1 | 9/2011 | Ishida et al. |
| 2011/0241205 A1 | 10/2011 | Kirby et al. |
| 2012/0132967 A1 | 5/2012 | Andry et al. |
| 2014/0131841 A1* | 5/2014 | Tseng .................. H01L 23/481 257/621 |
| 2014/0203412 A1* | 7/2014 | Wang et al. .................. 257/621 |

* cited by examiner

METHODS AND STRUCTURES TO FACILITATE THROUGH-SILICON VIAS

PRIORITY

This application claims the priority benefit under 35 U.S.C. §119(e) of U.S. Provisional Patent Application No. 61/789,571, filed Mar. 15, 2013, the entire disclosure of which is incorporated herein by reference.

BACKGROUND

1. Field

This disclosure relates generally to integrated circuits and their fabrication and, more particularly, to integrated circuit devices having through-silicon vias.

2. Description of the Related Art

To facilitate on-going trends in electronics for faster, more powerful, and denser integrated circuit devices, three dimensional (3-D) integration or packaging technology has been developed. Three-dimensional integration refers to the vertical stacking of multiple dies or wafers, each including integrated circuits (ICs), within a package. Holes or vias (known as "through-silicon vias", or "TSVs") extending through one or more wafers can contain conductive material such as copper and can be aligned when the wafers are stacked to provide electrical communication among the ICs in the stacked wafers. Thus, multiple wafers can be electrically connected using vertical-extending conductive structures formed in the vias.

In some other applications, the TSVs can also serve as a low inductance and low resistance connection among ICs in the stacked wafers or to a global ground plane.

Because the TSVs can be significantly larger than other features in an IC, formation of TSVs and the structures contacted by them can present particular challenges.

SUMMARY

According to some implementations, a method for integrated circuit fabrication is provided. The method comprises providing a first metal pad on a first metal level over a semiconductor substrate. A first plurality of openings is etched through the first metal pad. The semiconductor substrate is etched to form a through-silicon via exposing at least some openings of the plurality of openings.

According to some other implementations, an integrated circuit device is provided. The integrated circuit device comprises a first metal pad on a first level over a semiconductor substrate. The first metal pad comprises a first plurality of openings extending therethrough. The integrated circuit also comprises a through-silicon via extending through the semiconductor substrate to the first metal pad, the through-silicon via extending across at least some openings of the first plurality of openings.

According to yet other implementations, a system comprising an integrated circuit device is provided. The integrated circuit device comprises a first metal pad on a first level over a semiconductor substrate. The first metal pad comprises a first plurality of openings extending therethrough. The integrated circuit also comprises a through-silicon via extending through the semiconductor substrate to the first metal pad, the through-silicon via extending across at least some openings of the first plurality of openings.

DETAILED DESCRIPTION

Etches used to form through-silicon vias (TSV etches) may use a metal layer as an etch stop to prevent the etch from extending the via more deeply than desired. In some cases, this metal layer may be a metal pad to which the through-silicon via is designed to provide electrical communication. Thus, a metal pad as large as, or larger than, the area occupied by the through-silicon via may be used as an etch stop during formation of the through-silicon via. In addition, metal pads of this size may be desired to provide good electrical contact with conductive material in the through-silicon via.

The widths of through-silicon vias, however, can be significantly larger than the critical dimensions of many other features formed in integrated circuit fabrication. It has been found that the large area and volume of metal occupied by a metal pad used as an TSV etch stop can undesirably interfere with integrated circuit fabrication processes. For example, patterning such a large metal pad can degrade the ability to precisely define other metal features, such as smaller metal features, using patterning processes that define the other metal features simultaneously with the metal pad.

In some implementations, a metal pad, such as for capturing or interfacing with through-silicon vias, can function as an effective etch stop while also maintaining good compatibility with integrated circuit fabrication processes for defining other integrated circuit features (e.g., interconnects). The metal pad can have openings through it, thereby decreasing the amount of metal per unit area (the areal density of metal) relative to a pad formed by a continuous expanse of metal. The metal forming the pad can provide an etch stop for the through-silicon etches while the openings provide a relatively low areal metal density. Another metal pad on an upper level can also be provided with a plurality of openings in it. The metal pads on the different levels may be vertically aligned, e.g., in a column extending normal to the substrate surface, however, the placement of the openings in each metal pad is such that the openings are offset and substantially do not directly overlie or underlie one another. In some implementations, the metal density of the metal pads is less than about 85%, less than about 80%, or less than about 75%, where the percentages indicate the total area of the metal pad occupied by metal, with the total area being the area demarcated by the perimeter of the metal pad.

In some implementations, one or more additional metal pads may also be provided. These additional metal pads may be vertically aligned, e.g., in the column, with the above-noted metal pads and with openings that are also offset from and do not directly line up with openings in directly underlying or overlying metal pads. In some implementations, a continuous metal pad may overly other metal pads with openings in them.

As seen in a top-down view, the through-silicon via etch may "see" an etch stop that extends continuously across the width of the via, although different portions of the etch stop may be distributed on different vertical levels due to the presence of openings in the metal pads. Thus, a metal structure for stopping the through-silicon via etch is provided, while on each vertical level, the areal density of a particular metal pad is reduced compared to a metal pad formed by a continuous expanse of metal and a low resistance contact can be formed. As a result, formation of the through-silicon via and fabrication of integrated circuit components on each level having a metal pad can be facilitated.

After forming the through-silicon via, a conductive material, such as a metal, can be deposited into the via, thereby providing electrical contact to the metal pads. Advantageously, due to the openings in a lower-most metal pad (closest to the through-silicon via), the conductive material can extend through that lower-most metal pad to make contact with a higher level pad. Thus, low resistance electrical contact to multiple levels of metal pads can be made.

It will be appreciated that the metal pads on different vertical levels may be separated by dielectric material and that the through-silicon via etch can extend the openings in a metal pad to an immediately overlying dielectric material. It will also be appreciated that the metal pads may be electrically interconnected by conductor-filled vias that extend through the dielectric material between the metal pads. In some implementations, the conductor-filled vias are smaller than the metal pad openings and are placed in locations that border the openings that are extended into the dielectric material by the through-silicon via etch. In addition, the conductor-filled vias may be placed along a perimeter of the area occupied by the through-silicon via. Advantageously, the conductor filing the vias may be resistant to the etch, thereby forming a "cage" that confines the etch and reduces undesired lateral etching of material as well as providing low electrical resistance connection between metal layers.

Reference will now be made to the Figures, in which like reference numerals refer to like parts throughout. It will be appreciated that the figures, and different features within the same figure, are not necessarily drawn to scale.

Figure 4:
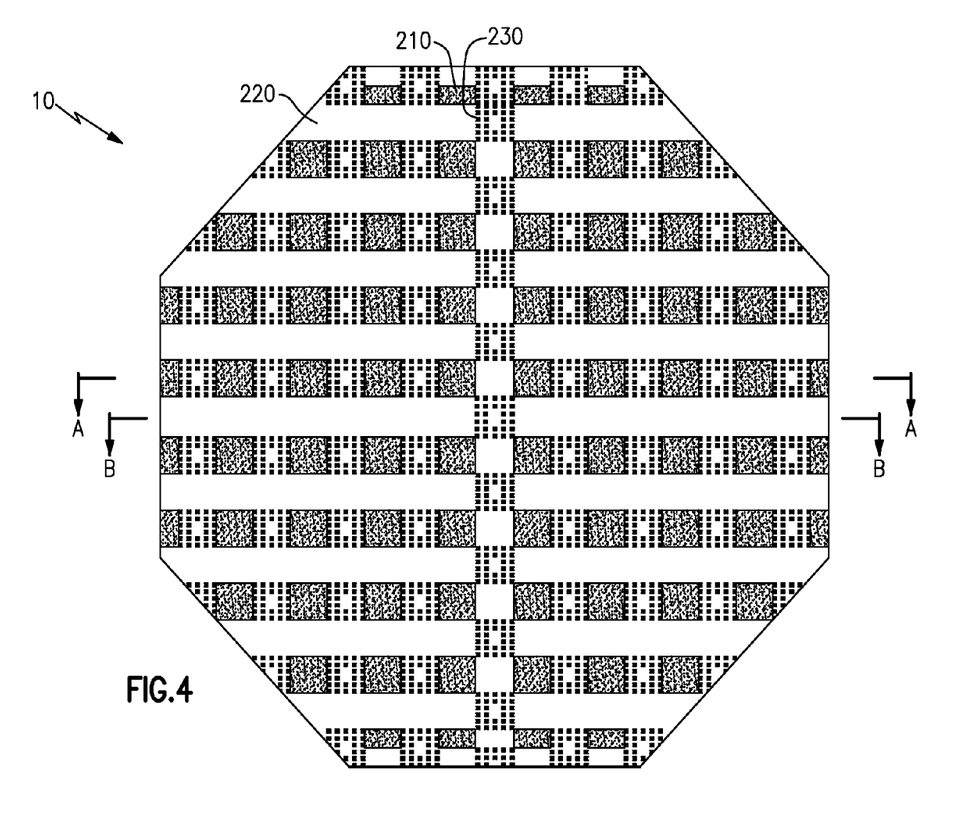
FIG. 4 shows an example of a dielectric layer having conductor-filled vias overlying the metal pad of FIG. 3.
Figure 5:
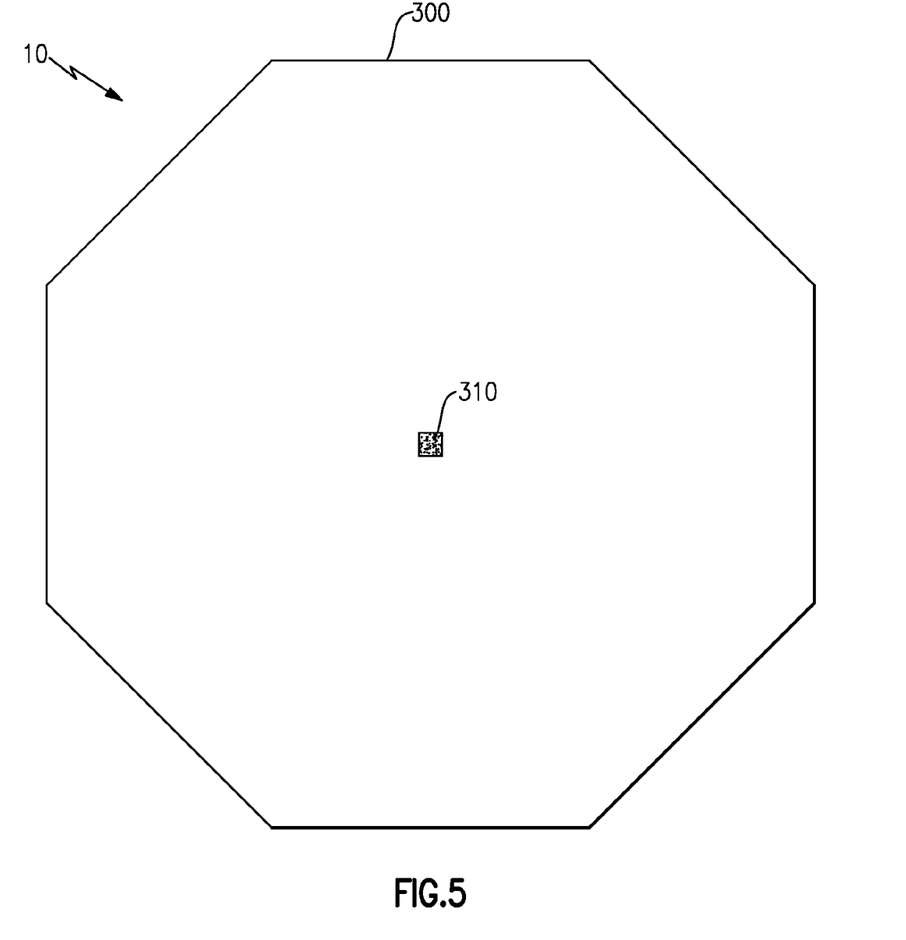
FIG. 5 shows an example of a cross-sectional top-down view of a metal pad on a third level overlying the dielectric layer of FIG. 4.
Figure 6:
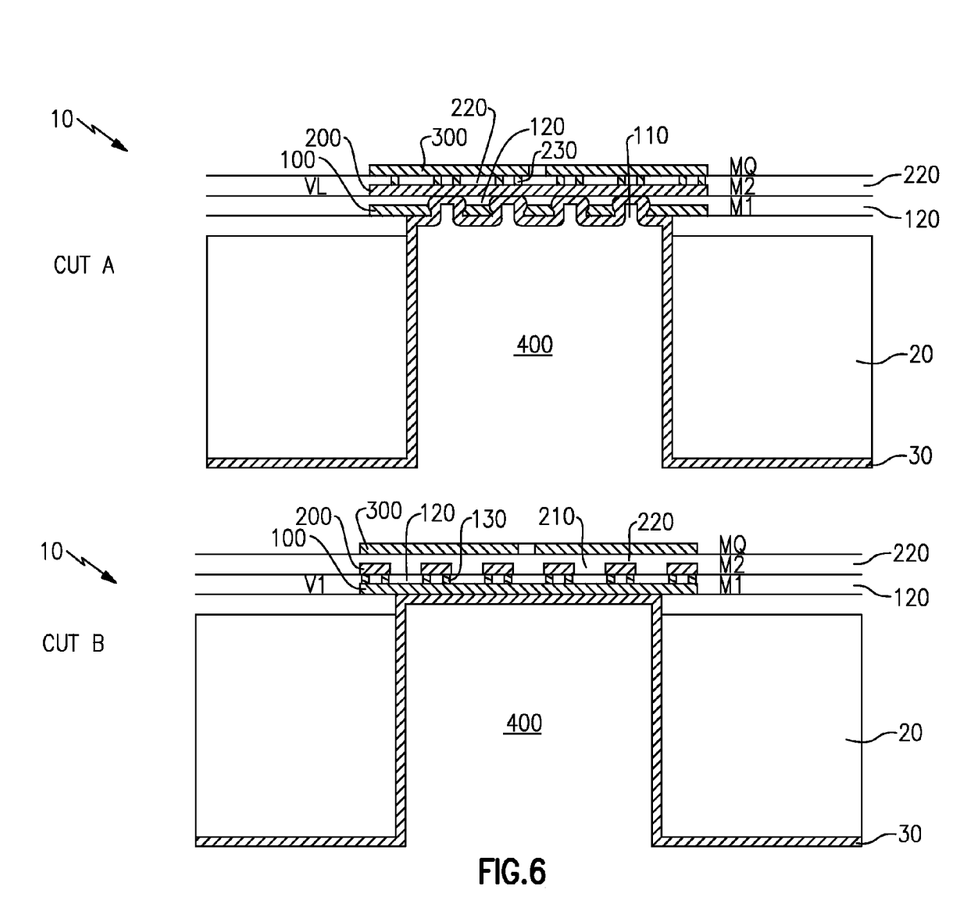
FIG. 6 shows examples of cross-sectional side views of the integrated circuit device of FIGS. 1-5, after depositing metal into the through-silicon via.

FIGS. 1-6 show various cross-sections of an integrated circuit device having a through-silicon via and multiple metal pads each having openings therein. FIGS. 1-5 illustrate cross-sectional top-down views taken at various vertical levels, before metal is deposited into the through-silicon via, and FIG. 6 illustrates cross-sectional side views taken along two different planes, after metal is deposited into the through-silicon via.

Figure 1:
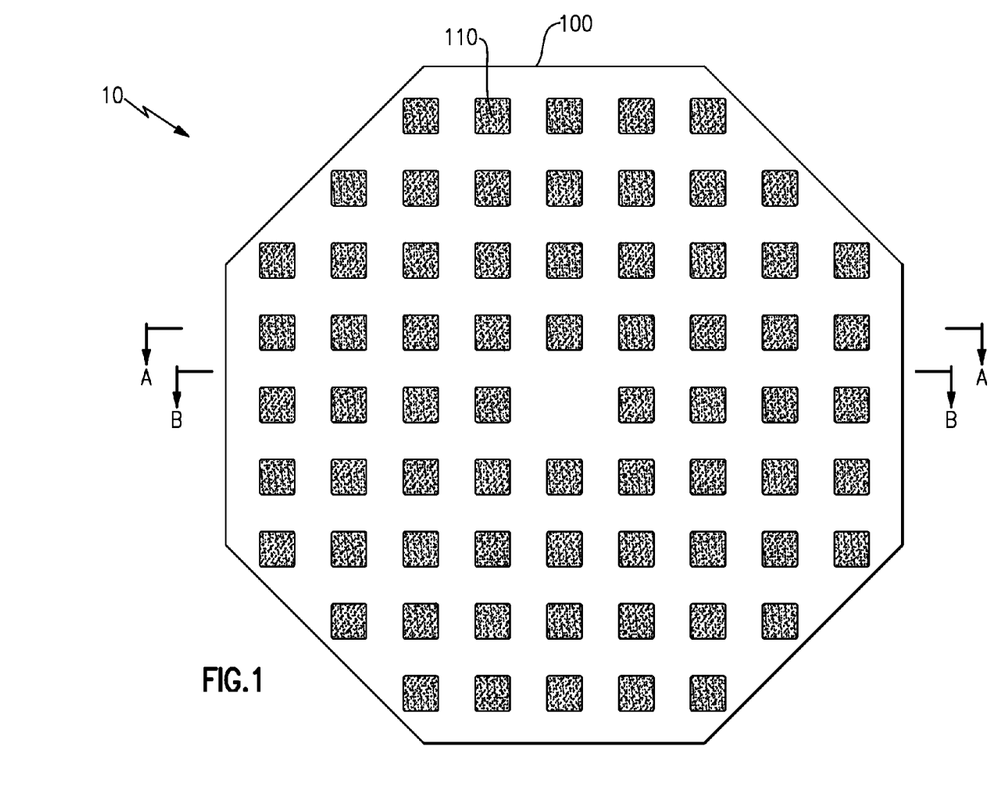
FIG. 1 shows an example of a cross-sectional top-down view of a metal pad on a first level of an integrated circuit device.

FIG. 1 shows an example of a cross-sectional top-down view of a metal pad 100 on a first level of an integrated circuit device 10. The metal pad 100 includes a plurality of openings 110 that extend completely through the pad 100. In some implementations, the metal pad is sized and shaped so as to extend across the entire area to be occupied by a through-silicon via. For example, the metal pad may have a generally octagonal, square, rectangular, or irregular shape, as seen in a top-down view. Non-limiting examples of metals for forming the metal pad include aluminum, copper, and combinations thereof.

As illustrated, the openings 110 may be substantially square in shape, which can provide advantages for fabrication and maintaining relatively uniform electrical resistance in various directions across the metal pad 100. In some other implementations, the openings 110 may have other arbitrary shapes, including rectangles, triangles, circles, and combinations thereof. Moreover, while shown uniform in the illustrated example, the openings 110 may have variations in size and position across the metal pad 100. In some implementations, the openings in the metal pad 100 may define various arbitrary patterns. In some implementations, the openings may be distributed over the majority of or across substantially an entire width of the metal pad 100. In some implementations, the numbers and sizes of the openings 110 (and openings in other metal pads) may be selected based upon the desired metal density. For example, the number and/or sizes of the openings 110 may be increased to decrease metal density; or the number and/or sizes of the openings 110 may be decreased to increase metal density.

Figure 2:
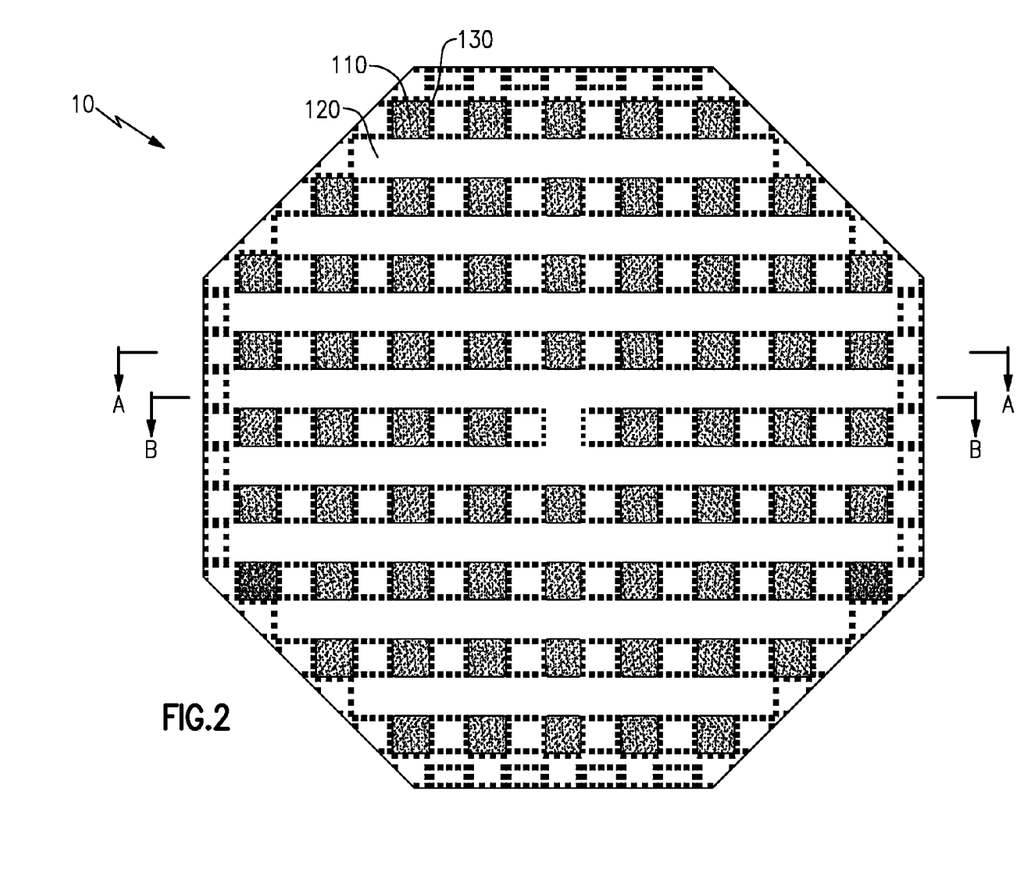
FIG. 2 shows an example of a cross-sectional top-down view of a dielectric layer having conductor-filled vias overlying the metal pad of FIG. 1.

A dielectric layer may be provided over the metal pad 100. FIG. 2 shows an example of a cross-sectional top-down view of a dielectric layer 120 having conductor-filled vias 130 overlying the metal pad 100 of FIG. 1. The conductor-filled vias 130 may provide electrical contact between metal pad 100 and conductive structures, such as another metal pad, on an overlying level. The conductor-filled vias 130 may be positioned so that they are localized around the perimeters of the openings 110, which have been extended into the dielectric layer 120 by the through-silicon via etch. As illustrated, the conductor-filled vias 130 may be disposed along two opposing sides of the openings 110. The conductor-filled vias 130 may contain metals that are resistant to the TSV etch, thereby advantageously at least partially confining etchants that may flow into the openings 110. As a result, undesirable lateral etching of the dielectric layer 120 can be reduced.

With continued reference to FIG. 2, conductor-filled vias 130 may also be localized around a perimeter of the metal pad 100 (FIG. 1). These conductor-filled vias 130 can facilitate the confinement of etchants from the TSV etch to within the area occupied by the metal pad 100.

Figure 3:
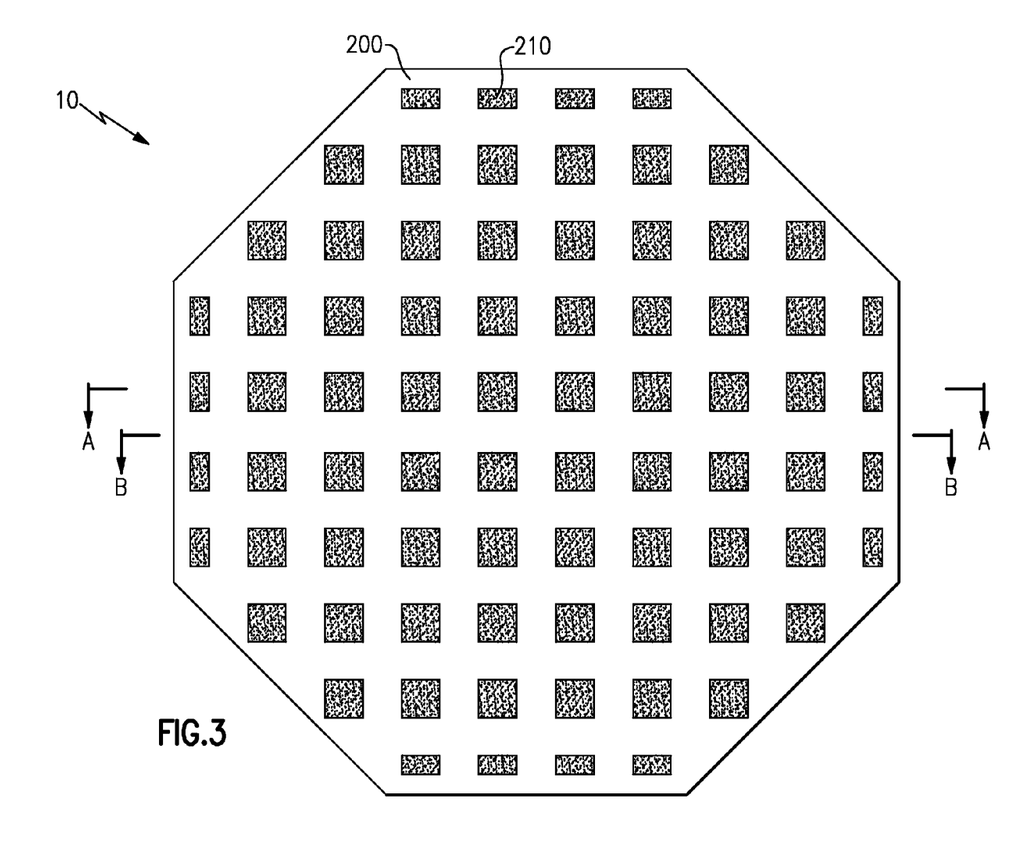
FIG. 3 shows an example of a cross-sectional top-down view of a metal pad on a second level overlying the dielectric layer of FIG. 2.

The integrated circuit device 10 may include additional vertical levels and metal pads on those levels. FIG. 3 shows an example of a cross-sectional top-down view of a metal pad 200 on a second level overlying the dielectric layer 120 of FIG. 2. The metal pad 200 is vertically-aligned with and substantially directly overlies the metal pad 100. Openings 210 are provided in the metal pad 200, with the openings 210 positioned such that they are offset from and do not directly overly the openings 110 (FIGS. 1 and 2). Thus, in some implementations, the openings 110 in the metal pad 100 extend into the dielectric layer 120 and terminate at the surface of the metal pad 200.

A dielectric layer may be provided over the metal pad 200. FIG. 4 shows an example of a dielectric layer 220 having conductor-filled vias 230 overlying the metal pad 200 of FIG. 3. The conductor-filled vias 230 may provide electrical contact between metal pad 200 and conductive structures, such as another metal pad, on an overlying level. It will be appreciated that, while etchant may enter the openings 110 in the metal pad 100 and extend into the dielectric layer 120 (FIG. 2), the metal pad 200 functions as an etch stop to prevent further etching and the openings 210 in the metal pad 200 are offset from the openings 110 such that significant amounts of etchant would not be expected to flow into those openings 210. FIG. 4 shows the locations of openings 210 and it is possible that some etchant may nevertheless enter the openings 210 to extend those openings into the dielectric layer 220. To confine further movement of etchant, the conductor-filled vias 230 may be positioned so that they are localized around the perimeters of the openings 210. In addition, while not illustrated, in some implementations, the conductor-filled vias 230 may also be localized around a perimeter of the metal pad 200 (FIG. 3), to further confine etchants from the TSV etch. In other implementations, additional conductor-filled vias 230 may be formed in locations other than around the perimeters of the openings 210. These additional vias 230 can provide additional electrical connections to further reduce the electrical resistance of the connection between metal pads.

In some implementations, one or more additional metal pads can be provided on additional levels overlying the dielectric layer 220. FIG. 5 shows an example of a cross-sectional top-down view of a metal pad 300 on a third level overlying the dielectric layer 220 of FIG. 4. The metal pad 300 is vertically-aligned with and substantially directly overlies the metal pad 200. One or more openings 310 can be provided in the metal pad 300, for example, to reduce metal density or the length of the expanse of uninterrupted metal. In some implementations, the opening(s) 310 are laterally offset from the openings 210 in the metal pad.

FIG. 6 shows examples of cross-sectional side views of the integrated circuit device 10 of FIGS. 1-5, after depositing metal into the through-silicon via. Cut A shows the view taken along plane A of FIGS. 1-5 and Cut B shows the view taken along plane B of FIGS. 1-5. With reference to both Cuts A and B, through-silicon via 400 is formed in substrate 20. The through-silicon via 400 extends across multiple ones of the openings 110 in the metal pad 100 and forms a continuous volume with those openings 110. In some implementations, metal deposited into the through-silicon via 400 lines the surfaces of the through-silicon via 400 to form a liner 30. The liner 30 can extend into the openings 110, thereby contacting both the metal pads 100 and 200. The liner 30 can include one or more layers of conductive material, which can include metals, such as copper, tungsten, nickel, and combinations thereof.

In some implementations, as illustrated in FIG. 6, the upper-most metal pad 300 may be exposed. Such an exposed metal pad 300 can allow electrical communication with another integrated circuit that may later be stacked over that metal pad. For example, in some implementations, the other integrated circuit may also be provided with a conductor-lined TSV, similar to TSV 400, which is aligned to make electrical contact with the exposed metal pad 300.

With reference to FIGS. 1-6, it will be appreciated that a metal pad to be contacted with a through-silicon via may be formed over a semiconductor substrate 20, such as a silicon wafer. In some implementations, the substrate can include one or more layers of materials, such as silicon and silicon oxide layers. In some implementations, a first metal layer may be deposited on a first level over the substrate and the metal layer may be patterned (e.g., by being subjected to an etch through an overlying etch mask), thereby defining the perimeter of the metal pad 100 and the openings 110 (FIGS. 1 and 6). This etch may also define other metal integrated circuit structures (e.g., interconnects) over the substrate.

A dielectric layer 120 may subsequently be deposited on the metal pad 100 to form additional integrated circuit structures on another vertical level (FIGS. 2 and 6). A second metal layer may be deposited over the dielectric layer and subsequently patterned to form the metal pad 200 and openings 210 (FIGS. 3 and 6).

Another dielectric layer 220 may subsequently be deposited on the metal pad 200 to form additional integrated circuit structures on yet another vertical level (FIGS. 4 and 6). A third metal layer may be deposited over the dielectric layer and subsequently patterned to form the metal pad 300 and opening(s) 310 (FIGS. 5 and 6). As desired, additional vertical levels having metal pads may be similarly formed.

Through-silicon via 400 may subsequently be formed (FIG. 6). In some implementations, the substrate may be thinned before subjecting the substrate to a through-silicon via etch. The etch may expose at least some of the openings 110 in the metal pad 100 and penetrate into the dielectric layer 120, thereby extending openings 110 into that layer.

Metal may subsequently be deposited into the through-silicon via 400. In some implementations, the extent of the deposition is such that a liner 30 is formed. Additional integrated circuit structures (e.g., integrated circuits on other wafers) may be attached in electrical communication with the liner 30.

It will also be appreciated by those skilled in the art that various omissions, additions and modifications may be made to the methods and structures described above without departing from the scope of the invention. For example, the sizes and/or shapes of metal pads on different vertical levels may vary and/or one or more of the sizes, shapes, and patterns made out by the openings in the various vertical levels may also vary between the metal pads. Moreover, terms such as "upper" and "lower" and "first" and "second" are sometimes used for ease of describing the figures, and indicate relative positions corresponding to the orientation of the figure, and may not reflect the orientation of, for example, an integrated device as implemented or rotated. All such modifications and changes are intended to fall within the scope of the invention, as defined by the appended claims.

What is claimed is:

1. An integrated circuit device, comprising:
   a first metal pad on a first level over a semiconductor substrate, the first metal pad comprising a first plurality of openings extending therethrough; and
   a through-silicon via extending through the semiconductor substrate to the first metal pad, the through-silicon via extending laterally across and vertically into at least some openings of the first plurality of openings.

2. The integrated circuit device of claim 1, further comprising a conductive liner lining walls of the through-silicon via and extending into the at least some openings of the first plurality of openings.

3. The integrated circuit device of claim 1, wherein the first metal pad comprises a metal chosen from the group consisting of copper, aluminum, and combinations thereof.

4. The integrated circuit device of claim 1, further comprising:
   a dielectric layer overlying the first metal pad;
   a second metal pad on a second level overlying the dielectric layer and substantially directly overlying the first metal pad, the second metal pad comprising a second plurality of openings extending therethrough;
   an other dielectric layer, the other dielectric layer overlying the second metal pad; and
   a third metal pad on a third level overlying the other dielectric layer and substantially directly overlying the second metal pad.

5. The integrated circuit device of claim 4, wherein openings of the second plurality of openings are aligned such that the openings of the second plurality of openings are offset from and substantially do not directly overlie openings of the first plurality of openings.

6. The integrated circuit device of claim 5, further comprising:
a first plurality of conductor-filled vias extending in the dielectric layer between the first and second metal pads,
wherein, as seen in a top-down view, vias of the first plurality of conductor-filled vias are localized around perimeters of openings of the first plurality of openings.

7. The integrated circuit device of claim 6, further comprising:
a second plurality of conductor-filled vias extending in the other dielectric layer between the second and third metal pads,
wherein, as seen in a top-down view, vias of the second plurality of conductor-filled vias are localized around perimeters of openings of the second plurality of openings.

8. The integrated circuit device of claim 6, wherein, as seen in a top-down view, vias of the first plurality of conductor-filled vias are further localized around a perimeter of the through-silicon via, thereby defining a cage around the perimeter of the through-silicon via.

9. A system comprising:
an integrated circuit device, comprising:
a first metal pad on a first level over a semiconductor substrate, the first metal pad comprising a first plurality of openings extending therethrough; and
a through-silicon via extending through the semiconductor substrate to the first metal pad, the through-silicon via extending laterally across and vertically into at least some openings of the first plurality of openings.

10. The system of claim 9, further comprising:
a dielectric layer overlying the first metal pad;
a second metal pad on a second level overlying the dielectric layer; and
a conductive liner lining walls of the through-silicon via and extending into the at least some openings of the first plurality of openings, the conductive liner contacting both the first and second metal pads.

11. The system of claim 10, wherein the second metal pad comprises a second plurality of openings extending therethrough, wherein openings of the second plurality of openings are aligned such that the openings of the second plurality of openings are offset from and substantially do not directly overlie openings of the first plurality of openings.

12. An integrated circuit device, comprising:
a first metal pad on a first level over a semiconductor substrate, the first metal pad comprising a first plurality of openings extending therethrough;
a through-silicon via extending through the semiconductor substrate to the first metal pad, the through-silicon via extending across at least some openings of the first plurality of openings;
a dielectric layer overlying the first metal pad;
a second metal pad on a second level overlying the dielectric layer and substantially directly overlying the first metal pad, the second metal pad comprising a second plurality of openings extending therethrough;
an other dielectric layer, the other dielectric layer overlying the second metal pad; and
a third metal pad on a third level overlying the other dielectric layer and substantially directly overlying the second metal pad.

13. The integrated circuit device of claim 12, wherein openings of the second plurality of openings are aligned such that the openings of the second plurality of openings are offset from and substantially do not directly overlie openings of the first plurality of openings.

14. The integrated circuit device of claim 13, further comprising:
a first plurality of conductor-filled vias extending in the dielectric layer between the first and second metal pads,
wherein, as seen in a top-down view, vias of the first plurality of conductor-filled vias are localized around perimeters of openings of the first plurality of openings.

15. The integrated circuit device of claim 14, further comprising:
a second plurality of conductor-filled vias extending in the other dielectric layer between the second and third metal pads,
wherein, as seen in a top-down view, vias of the second plurality of conductor-filled vias are localized around perimeters of openings of the second plurality of openings.

16. The integrated circuit device of claim 14, wherein, as seen in a top-down view, vias of the first plurality of conductor-filled vias are further localized around a perimeter of the through-silicon via, thereby defining a cage around the perimeter of the through-silicon via.

* * * * *